(12) United States Patent
Vokey et al.

(10) Patent No.: US 7,009,375 B1
(45) Date of Patent: Mar. 7, 2006

(54) LOCATING SYSTEM FOR A CABLE SYSTEM HAVING A BACKBONE AND BRANCH CABLES DEFINING MULTIPLE TERMINATIONS

(75) Inventors: David E. Vokey, Bellingham, WA (US);
Kenneth N. Sontag, Manitoba (CA);
Myron Loewen, Manitoba (CA)

(73) Assignee: Norscan Instruments Ltd., Manitoba (CA)

( * ) Notice: Subject to any disclaimer, the term of this patent is extended or adjusted under 35 U.S.C. 154(b) by 0 days.

(21) Appl. No.: 09/412,440

(22) Filed: Oct. 5, 1999

(51) Int. Cl.
*G01R 19/00* (2006.01)

(52) U.S. Cl. ....................................................... 324/67

(58) Field of Classification Search .................. 324/67
See application file for complete search history.

(56) References Cited

U.S. PATENT DOCUMENTS 3,980,840 A * 9/1976 Koster ..................... 379/27.01
6,411,074 B1 * 6/2002 Kruchowy et al. ........... 324/66

* cited by examiner

*Primary Examiner*—Bot Ledynh
*Assistant Examiner*—Reena Aurora
(74) *Attorney, Agent, or Firm*—Adrian D. Battison; Michael R. Williams; Ryan W. Dupuis

(57) ABSTRACT

A constant current termination is provided for cable locating tones on communication and control cables that may be buried or placed in underground duct structures. The constant current termination limits the current on each branch of the cable to that required for cable location, thus ensuring that branches furthest from the tone source have adequate current for location purposes. The termination is the same for each branch, regardless of its position along the cable system. This eliminates the need to calibrate and recalibrate termination distances for a cable on installation and when branches are added. It also allows the location of damaged cables where the tone signal strength on a damaged branch is less than that for which the termination was designed.

17 Claims, 2 Drawing Sheets

LOCATING SYSTEM FOR A CABLE SYSTEM HAVING A BACKBONE AND BRANCH CABLES DEFINING MULTIPLE TERMINATIONS

FIELD OF THE INVENTION

The present invention relates to the field of cable location and more particularly to the location of hidden or underground cables using a tone signal applied to the cable.

BACKGROUND

Telephone, cable television and other communication and control cables are often buried or placed in underground duct structures. For this type of cable placement, the most significant cause of cable outages is from dig ups by contractors. In an effort to minimize inadvertent dig ups, "call before you dig" programs are heavily promoted. The operating company must then be able to quickly and accurately locate and mark the buried cable.

Methods have been developed and are in commercial use which place a locating tone or signal in the form of an oscillating current at a predetermined frequency on the cable armour or shield. A special receiver with magnetic field detecting coils is used to sense the tone current travelling along the cable. The strength of the received signal is directly proportional to the magnitude of the tone current in the cable sheath directly below the receiver.

The transmission circuit for the tone current is formed by the metal armour or shield and insulated by the plastic cable jacket from earth which forms the return conductor. The circuit is basically a coaxial transmission path with the insulated cable armour forming the inner conductor and the surrounding earth forming the outer conductor.

The tone current must be present on all segments of a cable at a level greater than the minimum current dictated by the receiver sensitivity. This requires a termination at the end of the cable to draw at least the minimum amount of current. A distribution cable typically has a number of branch cables which must also draw enough tone current for cable locating. Since the current is heavily attenuated by the cable, the terminations near the source will draw a much higher current level than the distant terminations. To compensate for this, most installations use terminators with different signal load impedances for near, middle and far terminations. In addition to the inconvenience of using different impedances for different terminations, the known systems require recalculation and replacement of the terminators when an additional branch is connected.

Where a cable is damaged, the current level may fall below the minimum, making it difficult or impossible to locate the damaged cable.

SUMMARY

The present invention simplifies the terminator selection and mitigates problems created by the addition of branches and by cable damage.

According to one aspect of the present invention there is provided a tone locating system for a cable installation having a backbone cable, a plurality of branch cables, splices coupling the branch cables to the backbone cable and tone conductors along the backbone and branch cables, the tone conductors being connected at the splices, the locating system comprising:

a tone source connected to the tone conductor of the backbone cable at an inner end of the backbone cable;
a plurality of terminations connected to the respective tone conductors at ends thereof remote from the tone source and the splices, each termination comprising:
a load impedance connected to the respective tone conductor and to a tone signal return path; and
an active component responsive to variations in a voltage between the respective tone conductor and the return path to vary the magnitude of the load impedance to maintain a substantially constant current through the load impedance.

The invention thus simplifies the terminator selection and installation by replacing all of the different fixed load terminators of the prior art with a single device. A termination according to the invention draws only enough tone current to ensure location of the cable. It is not affected by the signal strength. This has the additional benefit of allowing the location of a damaged cable when the tone signal level is below that for which a fixed terminator would have been designed. If branches are added later, the termination loads do not have to be recalculated and replaced as with fixed terminators.

In a preferred embodiment of the present invention, the termination circuit has an input terminal for connection to the tone conductor of the cable and an output terminal for connection to a ground return path. A lightning protection device, e.g. a gas tube surge suppresser, a MOV or both, bridges the two terminals. A high pass filter is connected in series with the lightning protection to block low frequencies used by either equipment on the same cable conductor. Also in series with the lightning protection and the high pass filter is a band stop filter for filtering induced mains frequency signals. The signal thus processed is delivered to a rectifier, the output of which is connected to a series circuit including the load resistor and a variable impedance, which is in the preferred embodiment the drain to source path of a field effect transistor (FET). The gate and source of the FET are connected across the load resistor. The FET regulates the gate—source voltage and therefore the current draw of the load resistor. A high frequency bypass filter bridges the source and drain terminals of the FET to prevent ringing since the FET may turn on and off very quickly around the current limit with very large input currents. A zener diode is connected in parallel with the load resistance to prevent damage to the FET from input surges.

Other embodiments of the invention are possible using other forms of current limiting circuit, for example a voltage regulator based circuit.

According to a further aspect of the invention there is provided a method of providing a controlled signal current on a cable having opposite inner and outer ends and a signal conductor along a cable between the inner and outer ends, said method comprising:

applying an electrical signal to the signal conductor adjacent the inner end of the cable;
providing a resistive termination at the outer end of the cable, connecting the signal conductor to a signal return path;
monitoring the electrical signal at the termination; and
maintaining a substantially constant electrical signal current at the termination by varying the resistive termination in response to variations in the electrical signal at the termination.

According to another aspect of the invention there is provided a method of providing a controlled signal current on each of a backbone cable with inner and outer ends and a signal conductor from the inner end to the outer end and a plurality of branch cables with respective inner and outer ends and with the inner ends spliced to the backbone cable, each of the branch cables having a signal conductor spliced at the inner end of the branch cable to the signal conductor of the backbone cable, the method comprising:

applying an electrical signal to the signal conductor at the inner end of the backbone cable;

providing resistive terminations at the outer end of the backbone cable and at the outer end of each branch cable, connecting the signal conductor to a signal return path;

monitoring the electrical signal at each termination; and maintaining a substantially constant electrical signal current at each termination by varying the resistive termination in response to variations in the electrical signal at the termination.

BRIEF DESCRIPTION OF THE DRAWINGS

In the accompanying drawings, which illustrate an exemplary embodiment of the present invention.

DETAILED DESCRIPTION

Figure 1:
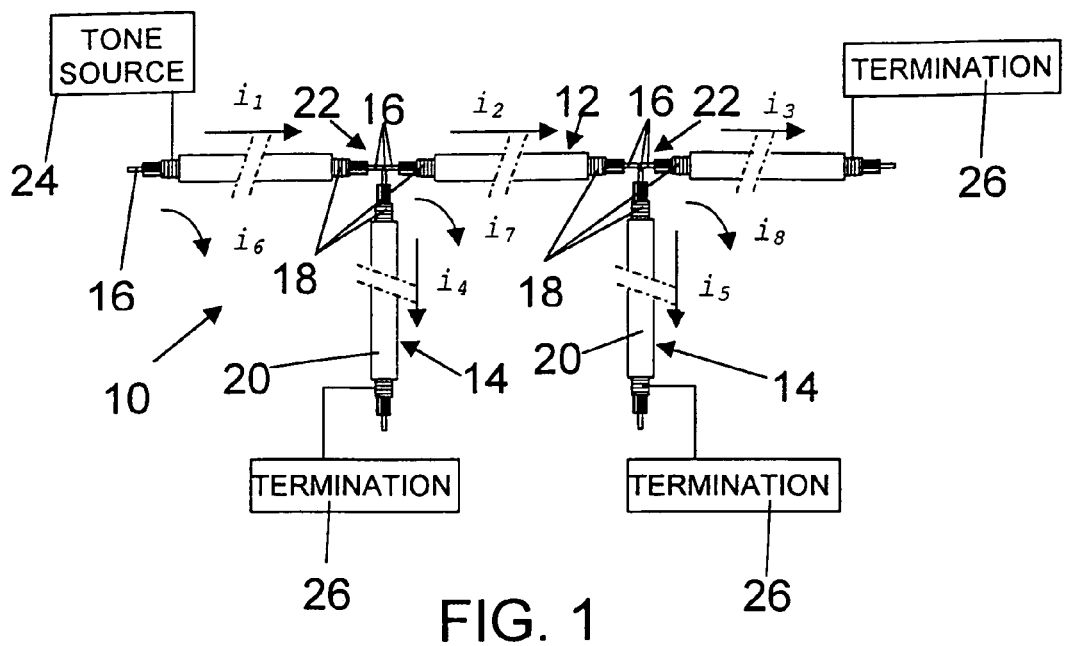
FIG. 1 is a representation of an exemplary cable topology showing termination and ground leakage currents.

Referring to the accompanying drawings FIG. 1 illustrate a cable system 10 that includes a backbone cable 12 and branch cables 14. Each of these cables has a core 16, a metallic armour 18 surrounding the core and a plastic material outer jacket 20. The branch cables 14 are connected to the backbone cable at splices 22. In the illustrated embodiment, the armour 18 of the cables is connected at the splices to serve as electrically connected tone conductors.

At an inner end of the backbone cable is a tone source or transmitter 24 that applies a tone signal or oscillating current of a predetermined frequency to the tone conductor. This is transmitted down the conductor to a termination 26 at the outer end of each of the cables.

The transmitter 24 generates the tone and transmits it on the cable system including the backbone cable 12 and the branch cables 14. The terminations, cable faults and cable capacitance to ground attenuate the amplitude of the signal. The amplitude of the signal is important because the current that flows generates a magnetic field which is radiated around the cable. This radiated field is not blocked by the surrounding soil and is readily detectable several meters away. The locating receiver has a coil that is excited by the magnetic field and converts the field back into an electrical signal.

Signals other than the locate tone may be induced on the cable, from low frequency power line harmonics to broadcast radio frequency signals. The noise level, sensitivity of the receiver and the maximum buried depth of the cable set the minimum required tone current. The Biot-Savart law establishes the relationship of the magnetic field intensity (H), tone current (I) and cable depth (r). The factor $a_0$ is a constant. This equation is simplified for DC current, but the relationship is the same.

$$H = \frac{I}{2\pi r} a_0$$

In normal practice, the minimum locating current specified by the receiver sensitivity for cable depth of one to two meters is 5 ma. This assumes typical ground conditions and noise levels. For extra safety margin, the minimum locating current on each segment should be 10 ma. Thus in FIG. 1, currents $i_1$, $i_2$, $i_3$, $i_4$ and $i_5$ should be 10 ma. Some current, designated $i_6$, $i_7$ and $i_8$ in FIG. 1 will be drawn by the cables' capacitive coupling to ground, especially with the higher frequency tones. Since the branches off the main cable may be very short and not have much capacitance, this current cannot be relied upon for locating all segments. When designing the tone source, this current has to be added to the maximum permissible fault current plus the number of terminations times the minimum locating current. The termination must draw the minimum locating current to ensure that no segment between the source and termination will carry less than the minimum current. In the example illustrated in FIG. 1, the tone source must supply current equal to $i_1+i_6$. Current $i_1$ is in turn the summation of the remaining currents $i_2$ through $i_5$ as shown in the drawing.

Figure 3:
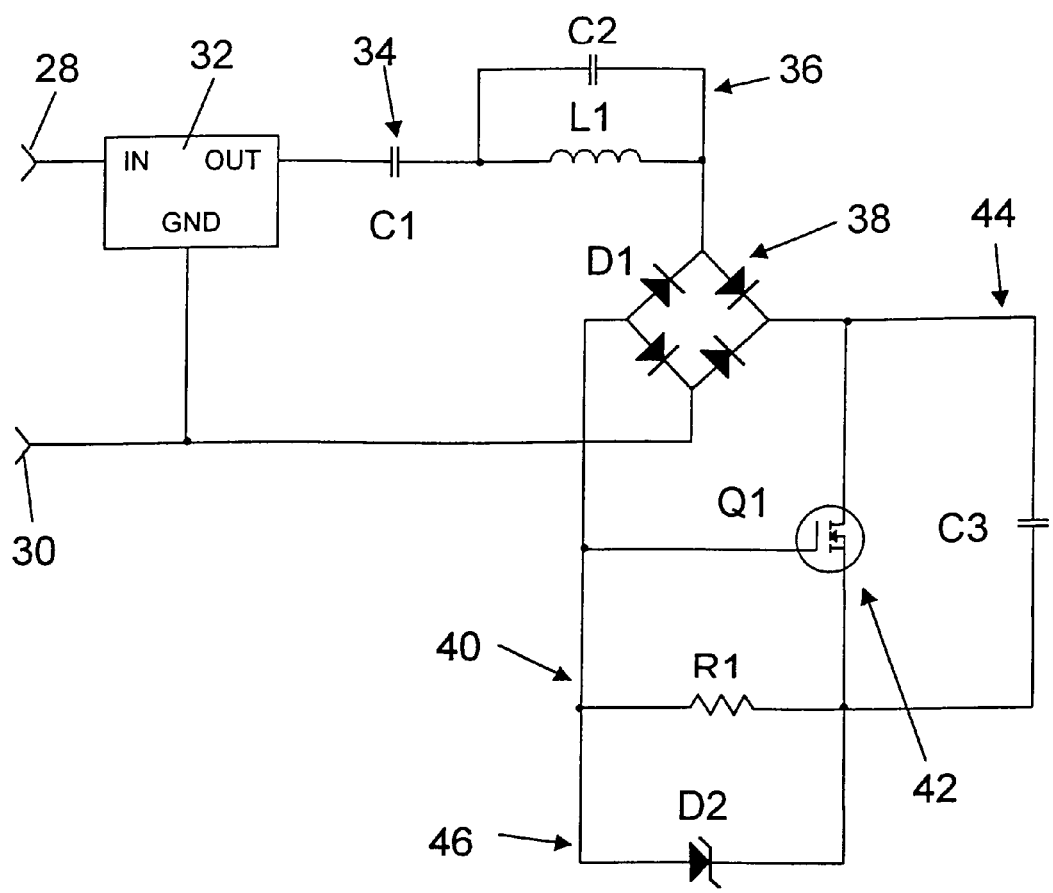
FIG. 3 is a circuit schematic of a termination according the present invention.

The load of each of the terminations 26 must draw the minimum required location current regardless of the input voltage or tone frequency. The electrical schematic of each termination is illustrated in FIG. 3. As shown in that drawing the termination has input terminals 28 and 30. Terminal 28 connects to the tone conductor of the cable while terminal 30 is connected to a ground return path. A lightning protection surge suppressor 32 is connected to the incoming signal wires to protect the termination from lightning.

The output terminal of the surge suppressor leads to a high pass filter 34 in the form of a large capacitor C1. Other equipment in the cable system may be connected to the cable sheath which is acting as the tone conductor and may apply a signal current thereto. This equipment generally operates to apply signal currents at very low frequencies, much below the frequency of the locating tones. The high pass filter 32 prevents interference with the other functions of the tone conductor so that, the termination will not discharge the signal currents of the other functions on the cable.

In series with the surge suppressor 32 and the high pass filter 34 is a band stop filter 36. The tone conductor typically has induced AC voltages from power lines at significant amplitudes relative to the amplitude of the tone current. These induced voltages are also discharged by the termination and add to the drawn current. If the induced voltages are large enough, they cause the current to limit at the minimum locating current. If a tone signal arrives at the termination with the current already limited, there will be no current draw at the tone frequency. If current is not drawn at the correct tone frequency, the locating receiver will filter away the signal from the current that is drawn from the induced voltages and will not be able to find the cable. The band stop filter 36 includes an inductor L1 and a capacitor C2 connected in parallel. The inductance and capacitance are calculated as follows:

$$freq = \frac{1}{2\pi\sqrt{LC}}$$

At the design frequency, normally 60 hz or 50 hz depending on the local mains frequency, the impedance of the inductor is equal and opposite to that of the capacitor. The currents are 180° out of phase and cancel each other out. For lower frequencies, the inductor shorts out the capacitor and for higher frequencies the capacitor shorts out the inductor.

In series with the surge suppresser 32, high pass filter 34 and band stop filter 36 is a rectifier 38. This is a diode bridge composed of four diodes D1 to provide a full wave rectification of the AC tone signal applied to the terminals 28 and 30. The output of the rectifier 38 is connected to a series circuit including a load impedance 40 and an active component 42. The load impedance 40 is a resistor R1, while the active component is a field effect transistor Q1 with the gate and source terminals connected across the resistor R1 and its drain terminal connected to the rectifier 38. The full wave rectifier 38 is employed in this embodiment because the constant current regulator is a DC device and the incoming tones are AC.

The constant current regulator works by detecting the current through the load resistor R1 and limiting the current when it reaches a set threshold. It limits the current by increasing the series impedance of the circuit so that the load resistor R1 gets less current. The impedance in this case is controlled by the biasing the depletion mode FET Q1 so that its gate voltage decreases relative to the source voltage as the drawn current increases. This will limit the gate voltage to the gate threshold voltage because any more current would gradually turn off the transistor.

$$I_{limit} = \frac{V_{gs}}{R_{sense}}$$

Since the gate voltage is limited and the load resister is fixed, the drawn current $I_{limit}$ is limited to:

The voltage $V_{gs}$ is a specification of the depletion mode FET, so R1 is chosen to set $I_{limit}$ to the minimum locate current.

Figure 2:
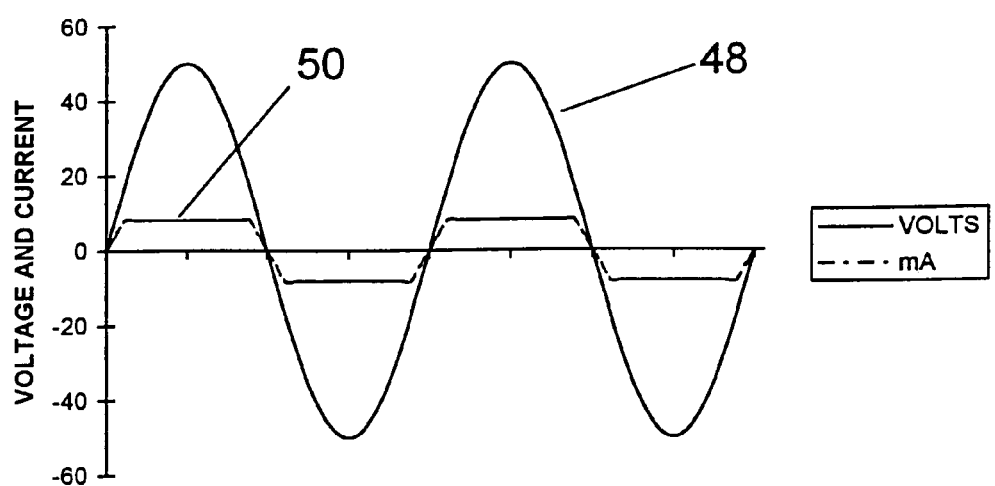
FIG. 2 is a graph showing voltage and current draw waveforms.

The resulting current wave form is shown in FIG. 2. It will look like the tone signal with the peaks chopped off because the current increases with the input tone voltage until the set current limit. The current stays at the limit until the tone input voltage comes back down. Thus, with a strong tone signal near the beginning of the cable, the current waveform will approach that of a square wave. A square wave of current is acceptable and is detectable by the tone receiver because the tone receiver locating the cable will filter harmonics and only detect the fundamental frequency.

The fourier expansion for a square wave is given by:

$$f(x) = \frac{4}{\pi} \sum_{n=1,3,5...} \frac{1}{n} \sin\frac{n\pi x}{L} = \frac{4}{\pi}\sin\frac{\pi x}{L} + \frac{4}{\pi}\sum_{n=3,5,7...} \frac{1}{n}\sin\frac{n\pi x}{L}$$

This indicates that the peak amplitude of the first harmonic (n=1) will be 4/$\pi$ times greater than the square wave peak. The peak of the sign wave must then be converted to an RMS value as follows:

$$V_{rms} = \frac{V_{peak}}{\sqrt{2}} = \frac{\frac{4}{\pi}}{\sqrt{2}} = 0.9000$$

With the tone current being 0.900 of the current limit, the calculations for the current limit will have to be 1/0.9 or 11% higher than the minimum desired locate current.

In use of the termination illustrated in FIG. 3, the lightning protector 32 protects the circuit from lightning. The capacitor C1 blocks DC and passes AC signals including the tone signal. The band stop filter 36 blocks any induced mains frequency currents. The rectifier 38 rectifies the incoming signal because the following current regulator is limited to one polarity. The field effect transistor Q1 regulates the gate to source voltage across the load resistor R1 to about 1.77 volts. The minimum locate current of 10 ma results in a maximum current limit set to 11.1 ma from the 11% correction calculated above. The value for the load resistor R1 is calculated as the gate to source voltage divided by the current limit. The high frequency bypass capacitor C3 prevents ringing as the FET would turn on and off very quickly around the current limit with very large input tones. The zener diode D2 clamps the gate voltage to a tolerable limit, say 5 volts, to prevent damage to FET Q1.

With this circuit tolerances may be quite large for the inductor L1 and some tuning of the capacitor C2 may be required to centre the band filter at 60 Hz or 50 Hz as the case may be.

While one embodiment of the present invention has been described in the foregoing, it is to be understood that other embodiments are possible within the scope of the invention. For example, various different forms of constant current regulator may be employed. It is for example, possible to produce a regulator for both polarities, thus eliminating the rectifier. Voltage regulator based limiters, can for example, be used. The invention is therefore to be considered limited solely by the scope of the appended claims.

What is claimed is:

1. A cable installation comprising:
   a backbone cable,
   a plurality of branch cables,
   splices coupling the branch cables to the backbone cable and tone conductors along the backbone and branch cables, the tone conductors being connected at the splices,
   and a cable locating system for locating the backbone cable and the branch cables, the system comprising:
   a tone source connected to the tone conductor of the backbone cable at an inner end of the backbone cable for transmitting a current signal on the tone conductors of the backbone cable and branch cables at a tone frequency;
   a plurality of terminations connected to the respective tone conductors at ends thereof remote from the tone source and the splices, each termination comprising:
   a load impedance connected between the respective tone conductor and a tone signal return path for discharge of current from the tone conductor; and
   an active component responsive to variations in a voltage in the load impedance to maintain a maximum amplitude of the current discharged at a substantially constant value.

2. A cable installation according to claim 1 wherein the load impedance includes a load resistor and the active component comprises means for maintaining the voltage across the load resistor substantially constant.

3. A cable installation according to claim 2 wherein the active component is a field effect transistor.

4. A cable installation according to claim 2 including a rectifier with an input for receiving current from the tone conductor an output connected to the load impedance.

5. A cable installation according to claim 1 including a high pass filter connected to the tone conductor for filtering frequencies below the tone frequency.

6. A cable installation according to claim 1 wherein the active component maintains the amplitude of the current below a predetermined maximum value.

7. A cable installation according to claim 1 including a mains frequency blocking filter connected to the to the tone conductor for filtering mains frequencies.

8. A cable installation according to claim 7 including a high pass filter connected to the mains frequency blocking filter.

9. A cable installation according to claim 1 including a surge suppresser connected between the tone conductor and the tone signal return path.

10. A method comprising:
providing a backbone cable with inner and outer ends and a signal conductor from the inner end to the outer end;
providing a plurality of branch cables with respective inner and outer ends and with the inner ends spliced to the backbone cable, each of the branch cables having a signal conductor spliced at the inner end of the branch cable to the signal conductor of the backbone cable;
applying an electrical signal to the signal conductor at the inner end of the backbone cable, the electrical signal defining an alternating tone current at a tone frequency;
providing resistive terminations at the outer end of the backbone cable and at the outer end of each branch cable,
providing a signal return path;
discharging the tone current at each termination to the signal return path;
and maintaining substantially constant a maximum amplitude of the discharged electrical signal current at each termination.

11. A cable installation comprising:
a backbone cable;
a plurality of branch cables;
splices coupling the branch cables to the backbone cable;
and tone conductors along the backbone and branch cables, the tone conductors being connected at the splices;
and a cable locating system for locating the backbone cable and the branch cables, the system comprising:
a tone source connected to the tone conductor of the backbone cable at an inner end of the backbone cable for applying a current signal to the tone conductors of the backbone cable and branch cables defining an alternating tone current at a tone frequency;
and a plurality of terminations each connected to a respective one of the tone conductors at ends thereof remote from the tone source and the splices;
each termination defining a load impedance between the respective tone conductor and a tone signal return path for discharge of the current signal from the tone conductor;
and each termination being arranged to limit an amplitude of the discharged current to a maximum value which is sufficient for cable location, thus ensuring that branches furthest from the tone source have adequate current for location purposes;
and the terminations being arranged such that the maximum value of the discharged current is the same at each termination.

12. A cable installation according to claim 11 wherein each termination includes a load resistor and a field effect transistor.

13. A cable installation according to claim 11 wherein each termination includes a high pass filter connected to the tone conductor for filtering frequencies below the tone frequency.

14. A cable installation according to claim 11 wherein each termination includes a mains frequency blocking filter connected to the to the tone conductor for filtering mains frequencies.

15. A cable installation according to claim 14 wherein each termination includes a high pass filter connected to the mains frequency blocking filter.

16. A cable installation according to claim 11 wherein each termination includes a surge suppresser connected between the tone conductor and the tone signal return path.

17. A method comprising:
providing a backbone cable;
providing a plurality of branch cables;
providing splices coupling the branch cables to the backbone cable;
providing tone conductors along the backbone and branch cables, the tone conductors being connected at the splices,
providing a tone source connected to the tone conductor of the backbone cable at an inner end of the backbone cable for applying a current signal to the tone conductors of the backbone cable and branch cables defining an alternating tone current at a tone frequency;
and providing a plurality of terminations each connected to a respective one of the tone conductors at ends thereof remote from the tone source and the splices;
arranging each termination to define a load impedance between the respective tone conductor and a tone signal return path for discharge of the current signal from the tone conductor;
at each termination limiting an amplitude of the discharged current to a maximum value which is sufficient for cable location, thus ensuring that branches furthest from the tone source have adequate current for location purposes;
and arranging the terminations such that the maximum value of the discharged current is the same at each termination.

* * * * *